United States Patent [19]

Strain et al.

[11] Patent Number: 5,453,389
[45] Date of Patent: Sep. 26, 1995

[54] DEFECT-FREE BIPOLAR PROCESS

[75] Inventors: Robert J. Strain; Sheldon Aronowitz, both of San Jose, Calif.

[73] Assignee: National Semiconductor, Inc., Santa Clara, Calif.

[21] Appl. No.: 113,772

[22] Filed: Aug. 27, 1993

(Under 37 CFR 1.47)

[51] Int. Cl.$^6$ .................................. H01L 21/265
[52] U.S. Cl. .............................. 437/31; 437/162; 437/22; 437/131; 437/950; 148/DIG. 123; 148/DIG. 144
[58] Field of Search ...................... 437/131, 162, 437/163, 25, 46, 22, 909, 950, 31, 32; 148/DIG. 123, DIG. 124, DIG. 144

[56] References Cited

U.S. PATENT DOCUMENTS

| | | | |
|---|---|---|---|
| 4,692,348 | 9/1987 | Rubloff et al. | 437/247 |
| 5,073,810 | 12/1991 | Owada et al. | 257/588 |
| 5,144,398 | 9/1992 | Morishita | 257/184 |
| 5,156,994 | 10/1992 | Moslehi | 437/89 |
| 5,242,847 | 9/1993 | Ozturk et al. | 437/162 |
| 5,254,484 | 10/1993 | Hefner et al. | 437/25 |
| 5,281,552 | 1/1994 | King et al. | 437/950 |
| 5,296,388 | 3/1994 | Kaneyama et al. | 437/31 |

FOREIGN PATENT DOCUMENTS 0165547  12/1985  European Pat. Off.
4221821  8/1992  Japan.

OTHER PUBLICATIONS

Japanese Journal of Applied Physics, vol. 28, No. 11, Nov. 1989, Tokyo JP pp. 2054–2056.
IBM Technical Disclosure Bulletin, vol. 23, No. 7B, Dec. 1980, New York US pp. 3236–3239.
IBM Technical Disclosure Bulletin, vol. 33, No. 12, May 1991, New York US p. 267.
Aronowitz, S. "Dopant diffusion control in silicon using germanium," *J. Appl. Phys.* 68(7), 1 Oct. 1990, pp. 3293–3297.

Coffa, S. et al. "Arsenic influence on extended defects produced in silicon by ion implantation," Appl. Phys. Lett. 56(24) 11 Jun. 1990, pp. 2405–2407.
Öztürk, M. C. et al. "Rapid Thermal Chemical Vapor Deposition of Germanium on Silicon and Silicon Dioxide and New Applications of Ge in ULSI Technologies," Journal of Electronic Materials, vol. 19, No. 10, 1990, pp. 1129–1134.
King, Tsu–Jae, et al. "A Polycrstalline–$Si_{1-x}Ge_x$–Gate CMOS Technology," IEDM 90-253-256.
Oehrlein, G. S. et al. "Selective Dry Etching of Germanium with Respect to Silicon & Vice Versa," *Electrochem. Soc.*, vol. 138 No. 5, May 1991, pp. 1443–1452.
Öztürk, M. C. et al. "Rapid Thermal Chemical Vapor Deposition of Germanium and Germanium/Silicon Alloys on SIlicon: New Applications in the Fabrication of MOS Transistors," *Mat. Res. Soc. Symp. Proc.* vol. 224, 1991, pp. 223–235.

(List continued on next page.)

*Primary Examiner*—Brian E. Hearn
*Assistant Examiner*—Tuan Nguyen
*Attorney, Agent, or Firm*—Townsend and Townsend and Crew

[57] ABSTRACT

A method for manufacturing bipolar semiconductor devices wherein damage to the active regions of the devices due to the direct implantation of impurities is suppressed. A material is selectively deposited on a semiconductor substrate, the material having a characteristic such that formation of the material occurs on some substances such as silicon and polysilicon, and formation of the material is suppressed on other substances such as silicon dioxide and silicon nitride. Impurities are introduced into the material rather than into the substrate. The impurities are then diffused into the active regions by standard processes such as rapid thermal anneal (RTA) or furnace anneal. The material generally contains germanium, and usually is a polycrystalline silicon-germanium alloy. The diffusion depth of the impurities may be controlled with great precision by manipulating several parameters. The parameters include the thickness of the material, the energy of the impurity implants, the density of the impurity implants, and the concentration of germanium in the material.

17 Claims, 8 Drawing Sheets

OTHER PUBLICATIONS

Grider, D. T. jet al. "Ultra–Shallow Junction Formation by Diffusion from Polycrystalline $Si_xGe_{1-x}$ Alloys," *3rd Int. Symp. on Ultra Lg. Scale Integration Sci. & Tech. Proc.* vol. 91–11, Electrochem. Soc. 1991, pp. 296–305.

Sanganeria, M. et al. "Optimization of Process Conditions for Selective Deposition of Polycrystalline $Si_xGe_{1-x}$ Alloys in a Rapid Thermal Processor," *3rd Intl. Symp. on Ultra Large Scale Integration Sci. & Tech.* vol. 91–11, Electrochem. Soc. '91 pp. 851–861.

Aronowitz, S. et al. "Damage Freeze–in Phenomena as a Function of Dopant Implant; Type in Germanium–Rich Regions in Silicon," *Mat. Res. Soc. Symp. Proc.,* vol. 209, 1991, pp. 481–487.

DEFECT-FREE BIPOLAR PROCESS

BACKGROUND OF THE INVENTION

This invention relates to a "defect-free" bipolar process, and also to a CMOS self-aligned process which is described herein and is the subject of a commonly assigned, co-pending patent application entitled SELF-ALIGNED CMOS PROCESS.

Any degree of damage or defect formation introduced into silicon during processing degrades yield and performance. This degradation is especially pronounced in sub-micron and deep sub-micron structures. For example, when such damage occurs in source/drain regions of CMOS devices, subtle effects such as increased leakage currents, localized avalanching, and increased device failure rates can result.

Direct implantation of dopants into designated regions of the silicon for CMOS source/drain or bipolar emitter/collector formation introduces damage. This type of damage is often very difficult to remove. Moreover, permanent damage results from lattice displacements which are generated by the electronic energy loss of the implanted dopant species along its path in the silicon.

Deposition of germanium or polycrystalline silicon-germanium ($Si_{1-x}Ge_x$) alloys may be made selective with respect to silicon and $SiO_2$ surfaces. It has been demonstrated experimentally that deposition of germanium or silicon-germanium alloys onto $SiO_2$ can be totally suppressed. This feature permits either germanium or alloys of silicon and germanium to be used in self-aligned processes both as masks and as dopant sources. This is particularly relevant when germanium is used in the silicon substrate to control diffusion of n-type dopant species. Implantation of n-type dopants into regions of silicon that have very high concentrations of germanium, by theory and experiment, lead to damage freeze-in. That is, damage is permanent because of the attractive interactions between the n-type dopant and the germanium, as well as the interstitial silicon in the damaged portions of the silicon and the germanium. Therefore, although germanium can be used to control diffusion of n-type dopants, permanent damage may be introduced if the n-type dopant is implanted in high doses. One alternative is to deliver the n-type dopant to the substrate by another process which shifts any damage to materials that will ultimately be removed from the structure. This is a general approach, as will be illustrated below.

Selectivity is not only confined to deposition processes but also can be developed with etching processes. Conventional selectivity between $SiO_2$ and polysilicon extends to poly-SiGe films as well as germanium. Moreover, there are dry etching processes that can be made selective with respect to germanium versus silicon.

In light of the foregoing, it is evident that there is a need for processes that will suppress the defect generation due to the implantation of impurities during semiconductor fabrication.

SUMMARY OF THE INVENTION

According to the invention, a method of manufacturing semiconductor devices is described wherein damage to the devices' active regions due to the direct implantation of impurities is suppressed. A material is selectively deposited on a semiconductor substrate, the material having a characteristic such that formation of the material occurs on some substances such as silicon and polysilicon, and formation of the material is suppressed on other substances such as silicon dioxide and silicon nitride. Impurity implants are introduced into the material rather than into the substrate. The impurity implants are then diffused into the active regions by standard processes such as rapid thermal anneal (RTA) or furnace anneal.

The material generally contains germanium, and usually is a polycrystalline silicon-germanium alloy. The diffusion depth of the impurity implants may be controlled with great precision by manipulating several parameters. The parameters include the thickness of the material, the energy of the impurity implants, the density of the impurity implants, and the concentration of germanium in the material.

One embodiment of the invention is a method of manufacturing CMOS devices using a self-aligned process. Wells are formed in the device substrate and the active regions are isolated using a self-aligned process, or any other standard technique. A first material comprising germanium, preferably a silicon-germanium alloy, is selectively deposited on the active regions of the device. Impurity implants to be used in channel formation are introduced into the first material and then diffused into the active regions by RTA or furnace anneals. The first material is then selectively removed. A gate dielectric layer is then grown or deposited on the device. A thin polysilicon layer—doped or undoped—is deposited on the gate dielectric layer. A material which suppresses the formation of $Si_{1-x}Ge_x$ polycrystalline alloy, such as a nitride or an oxide, is then deposited on the polysilicon layer. Gates are then defined on the active regions, the gates being isolated islands comprising the gate dielectric layer, the polysilicon layer, and the suppressant layer. A second suppressant layer is then deposited on the device and etched to form dielectric spacers on the sides of the gates. The first suppressant layer on the polysilicon layer of each gate is removed and a second material, preferably another silicon-germanium alloy, is selectively deposited on the polysilicon layer of each gate and any exposed areas of the active regions. Second impurity implants are introduced into the second material and then diffused into the active regions to form source and drain regions, and into the polysilicon layer of each gate. Finally, silicide contacts are formed on the second material.

Another embodiment of the invention is a method of manufacturing bipolar devices using a self-aligned process. A heavily doped sub-collector region of a first conductivity type is formed in a semiconductor substrate of a second conductivity type. An epitaxial layer of the first conductivity type is grown to supply proper collector doping, the epitaxial layer being lightly doped with respect to the sub-collector region. Active regions in the semiconductor device are isolated by selective diffusion or oxidation, and finally prepared for further processing by growing a layer of oxide over the active regions. An intrinsic base is formed by implanting an impurity of the second conductivity type through the oxide layer. Apertures are etched in the oxide layer for base, emitter, and collector contacts. Impurity implants of the first conductivity type are then introduced into the collector contact aperture to form a highly conductive path to the sub-collector. A material, preferably a silicon-germanium alloy, is selectively deposited on areas free of the oxide layer. Impurity implants of the second conductivity type are introduced into the material formed in the base contact aperture and impurity implants of the first conductivity type are introduced into the material formed in the collector and emitter contact apertures. The impurity implants are then diffused into the active regions of the device. Finally, silicide contacts are formed on the material.

A further understanding of the nature and advantages of the present invention may be realized by reference to the remaining portions of the specification and the drawings.

DESCRIPTION OF THE SPECIFIC EMBODIMENTS

The following are descriptions of two specific embodiments of the present invention. The first is a fully self-aligned, defect-suppressed CMOS process. The second is a defect-free bipolar application.

Figure 1:
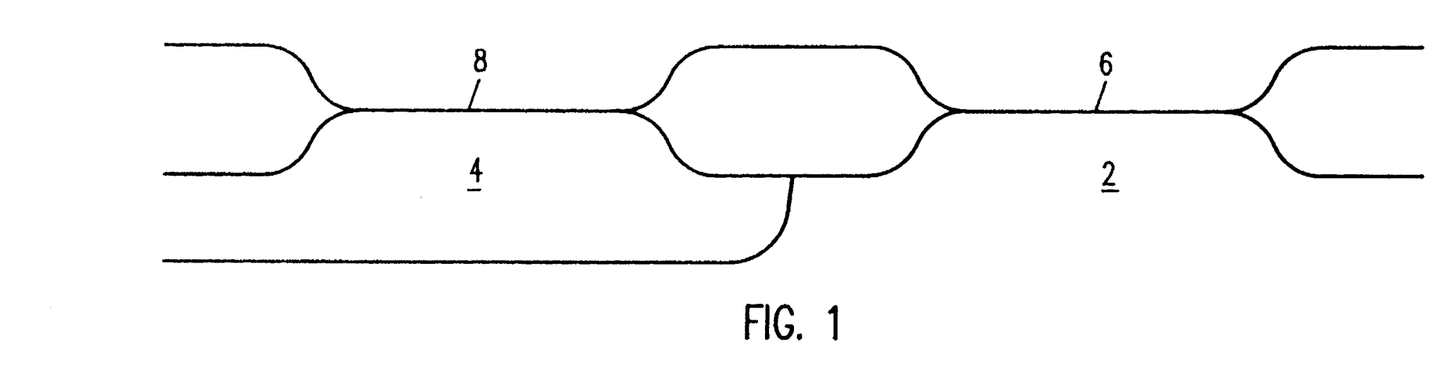
FIGS. 1 through 12 illustrate process steps in the fabrication of a CMOS device according to the present invention.
Figure 2:
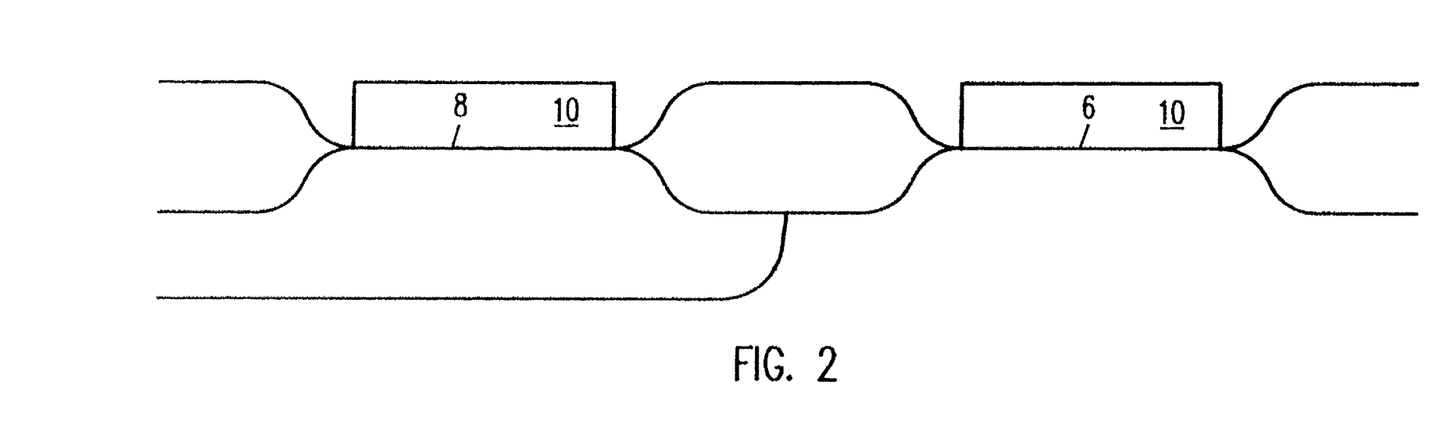
Figure 3:
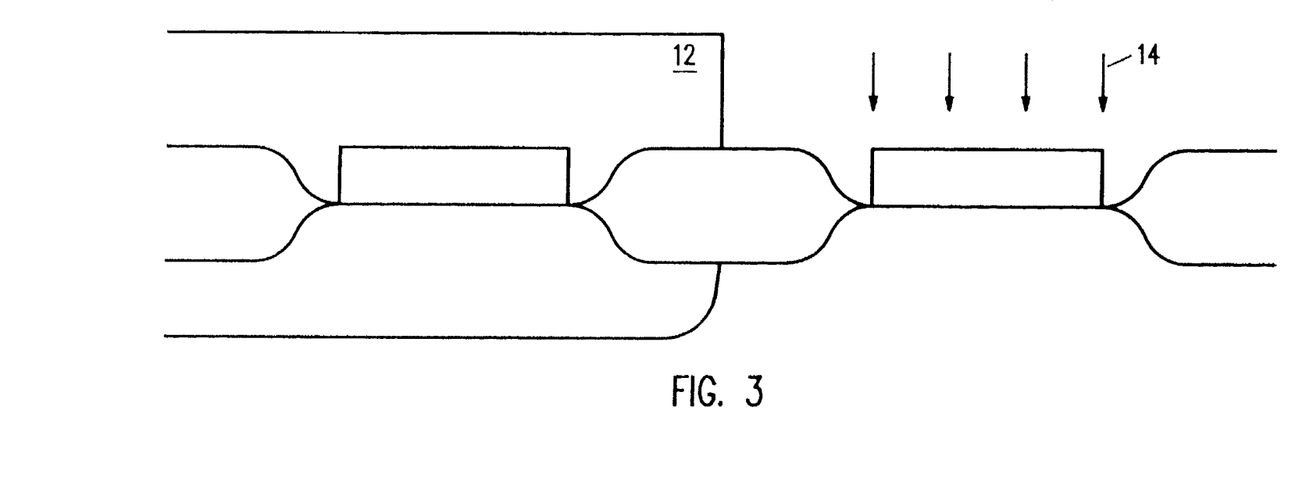
Figure 4:
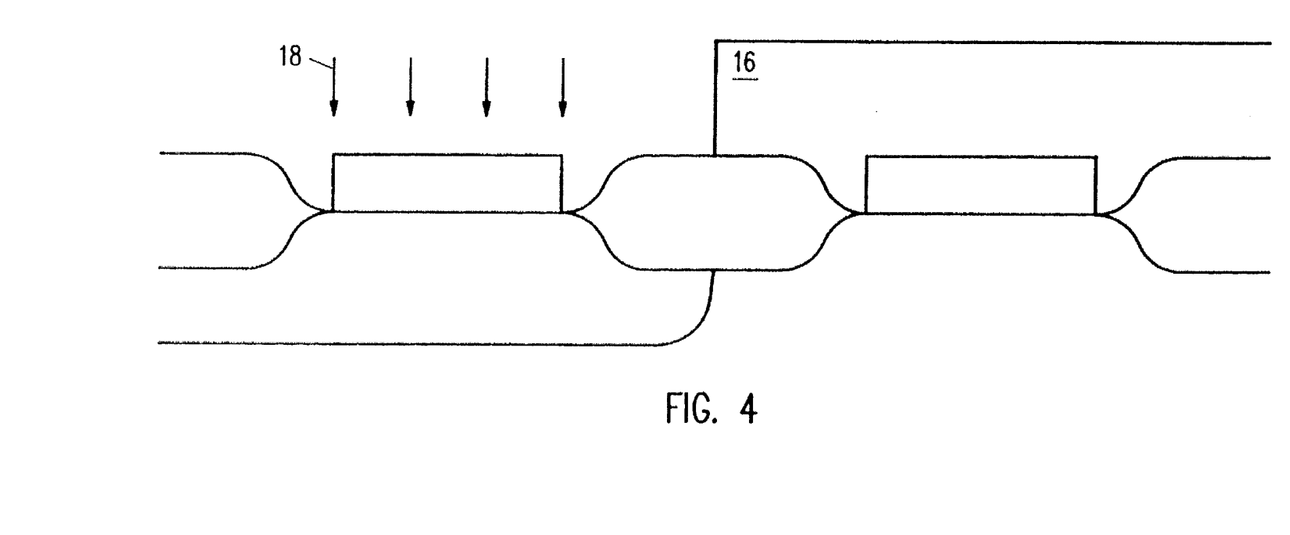

A self-aligned CMOS process which suppresses implant damage in device active regions is schematically illustrated in FIGS. 1 to 12. The process begins with well formation. In FIG. 1, p-type regions 2 and n-type wells 4 are formed and the active regions 6 and 8 are isolated using any well known isolation methodology. The wells 2 and 4 of FIG. 1 may be formed by a self-aligned process, or by any of various known methods. A silicon-germanium alloy 10 is then selectively deposited on the active areas 6 and 8 (FIG. 2). Depending on the process requirements, either uniform or masked threshold adjust implants are introduced into the deposited silicon-germanium layer. Masked implants are shown in FIGS. 3 and 4. In FIG. 3, a resist material 12 is deposited on the device as shown, and n-type dopant implants 14 are introduced into the silicon-germanium alloy 10. FIG. 4 shows a subsequent step in which a resist material 16 is deposited as shown, and p-type dopant implants 18 are introduced.

Figure 5:
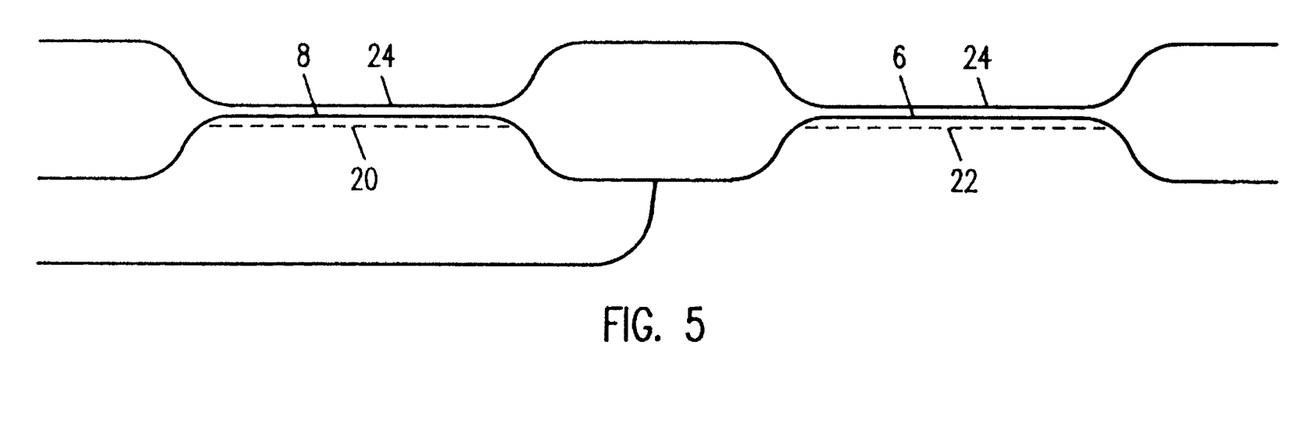
Figure 6:
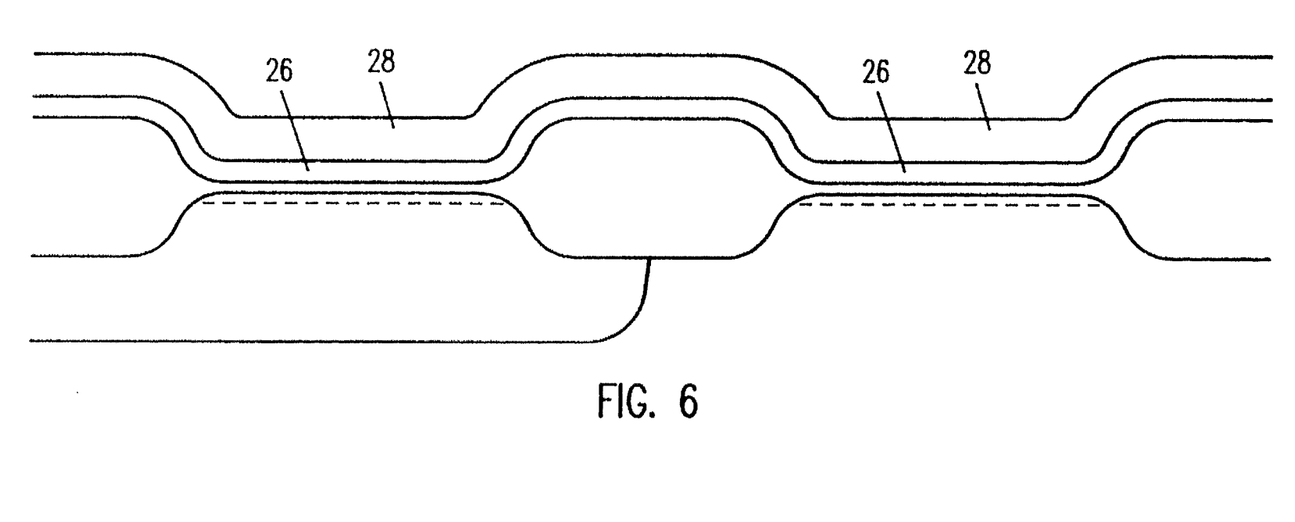
Figure 7:
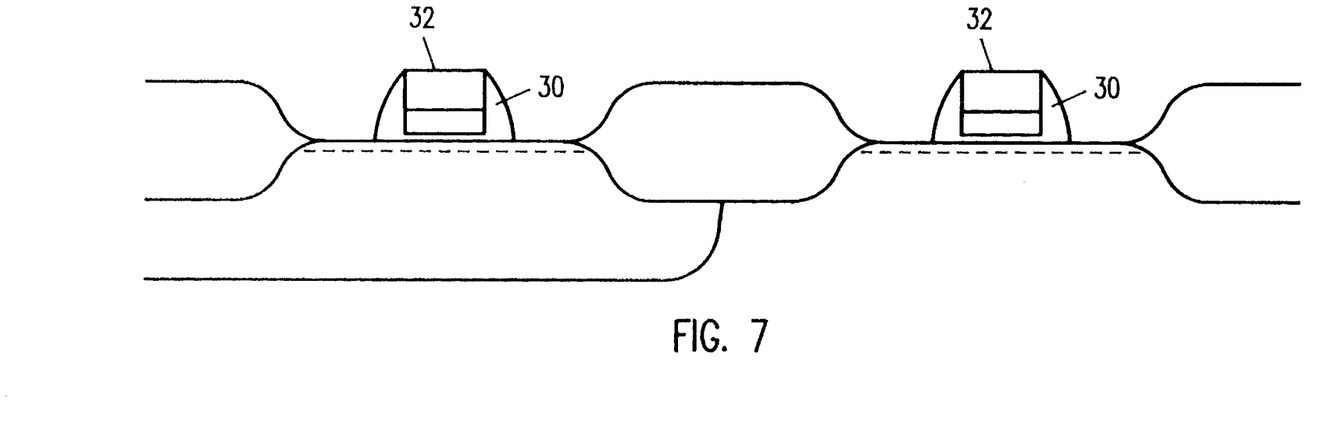
Figure 8:
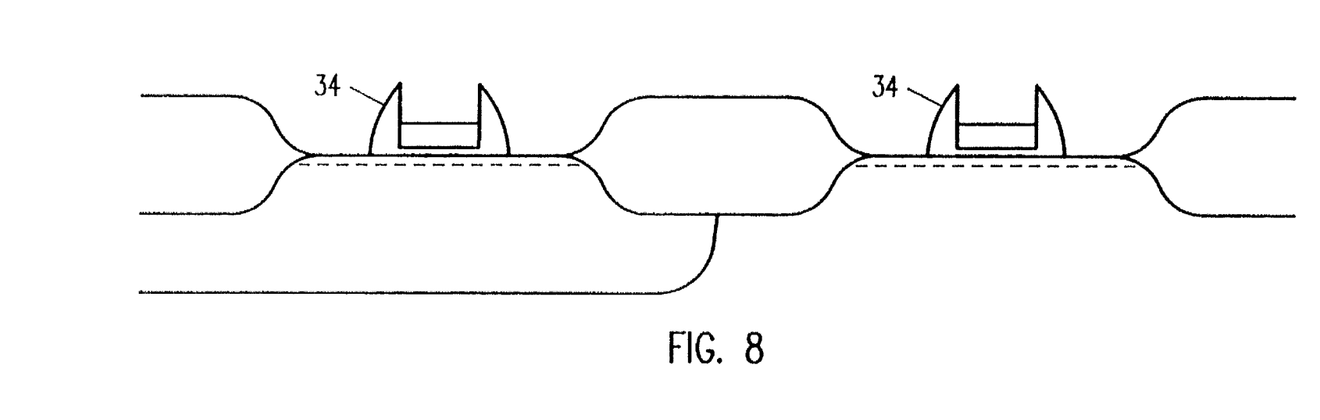
Figure 9:
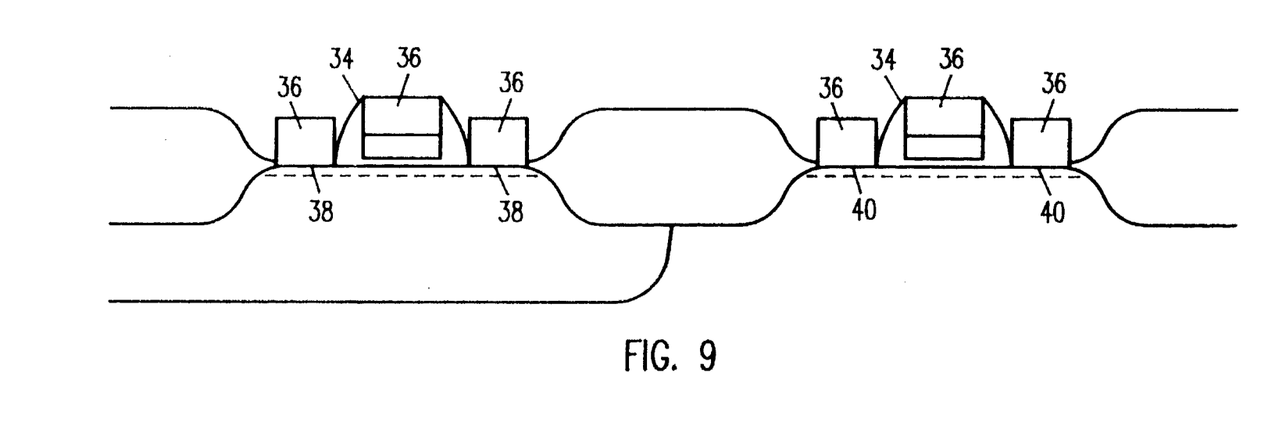
Figure 10:
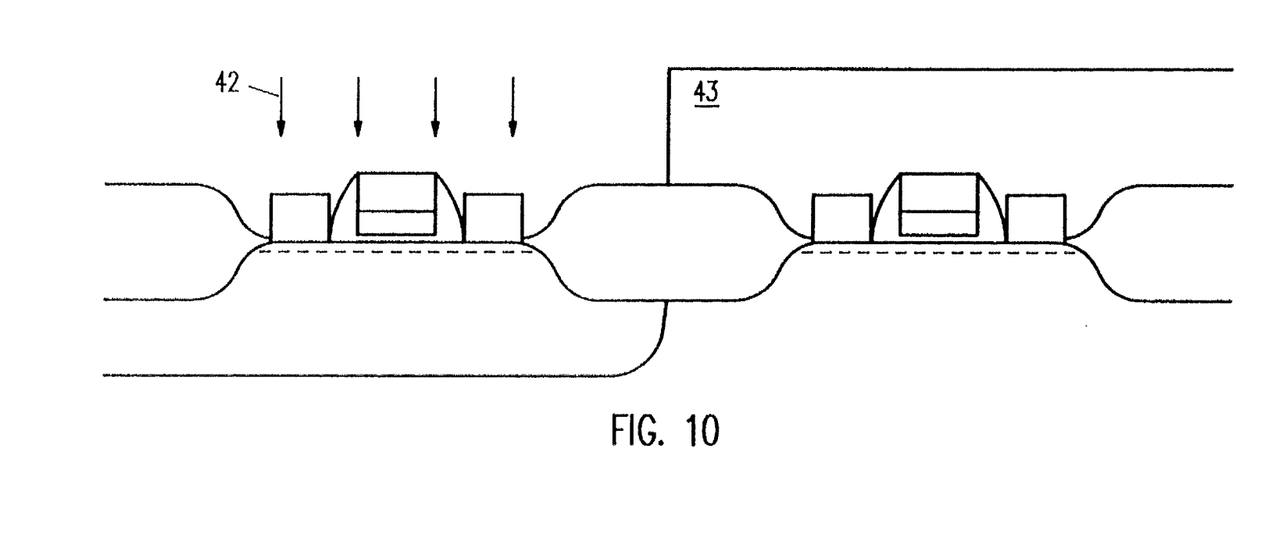
Figure 11:
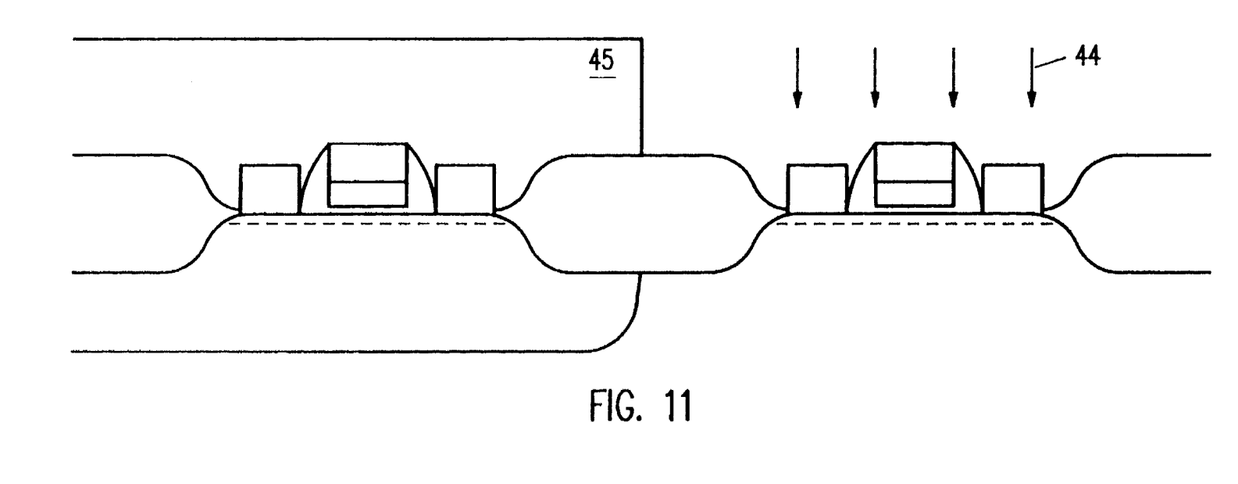
Figure 12:
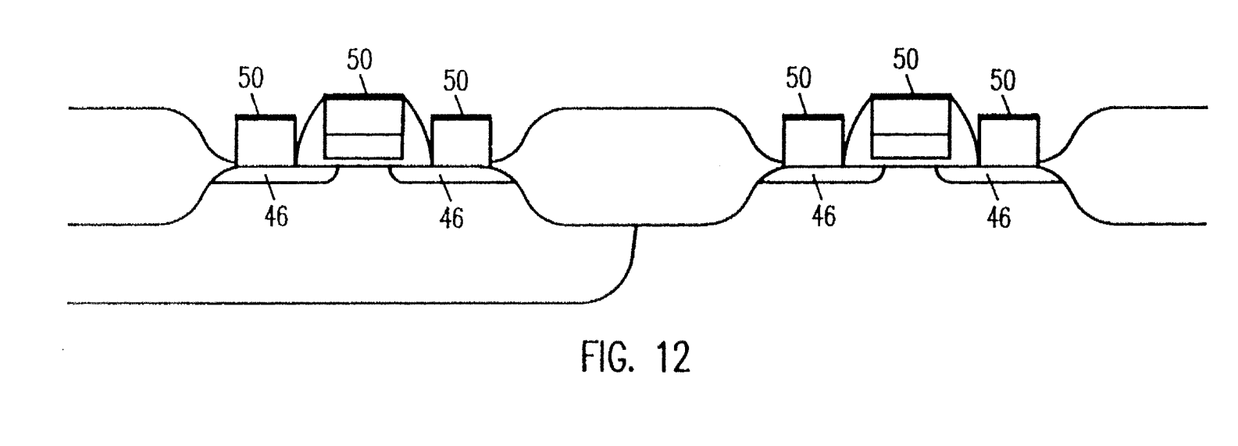
Figure 13:
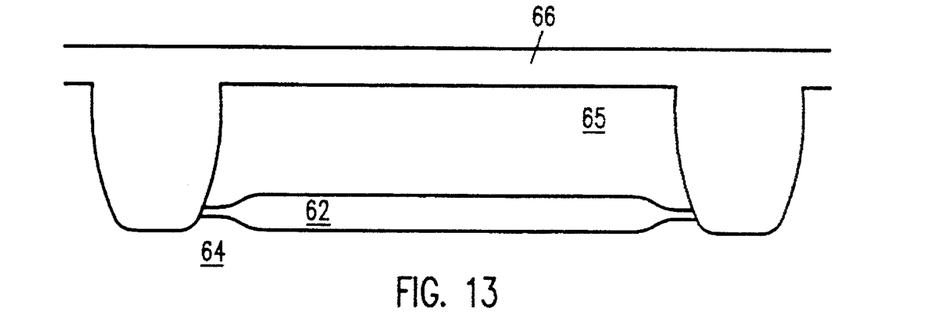
FIGS. 13 through 20 illustrate process steps in the fabrication of a bipolar device according to the present invention.

Following the diffusion of the dopants into the active regions by RTA or furnace anneals creating doped regions 20 and 22, the silicon-germanium alloy is removed by selective etching (FIG. 5). A gate dielectric 24 is then deposited or grown on the active regions 6 and 8. This is followed by the deposition of a thin polysilicon layer 26 along with a nitride layer 28 (FIG. 6). The gate is defined on this poly/nitride composite. A spacer dielectric 30 is deposited and etched back, yielding the structure 32 shown in FIG. 7. After the nitride layer on the gate polysilicon is removed, a new structure 34 of FIG. 8 is ready for another selective silicon-germanium alloy deposition. This second silicon-germanium material 36 is formed on the gate structure 34 and on the source/drain regions 38 and 40 resulting in the structure shown in FIG. 9. Masked p-type implants 42 and n-type implants 44 provide the source/drain and gate dopants simultaneously, with the adjacent device protected by mask 43 and 45 (FIGS. 10 and 11). RTA and/or furnace anneals form the source/drain junctions 46 and 48 and activate the dopants (FIG. 12). The structure then is silicided to form the contacts 50 without degrading or encroaching into the shallow source/drain regions 46 and 48.

A self-aligned bipolar process is schematically illustrated in FIGS. 13 to 20. Assume that the following has been accomplished by standard processing sequences. A heavy N$^+$ collector 62 has been formed in a p-type substrate 64. Either a lightly doped N-type or N-doped epitaxial layer has been grown to supply proper collector doping (65). Active regions have been defined by combinations of P$^+$ implants and diffusions, silicon removal, and oxidation or oxide depositions. Finally, an oxide 66 of appropriate thickness has been grown, resulting in the structure 60 displayed in FIG. 13. At this point the structure 60 is ready for the formation of active bipolar devices.

Figure 14:
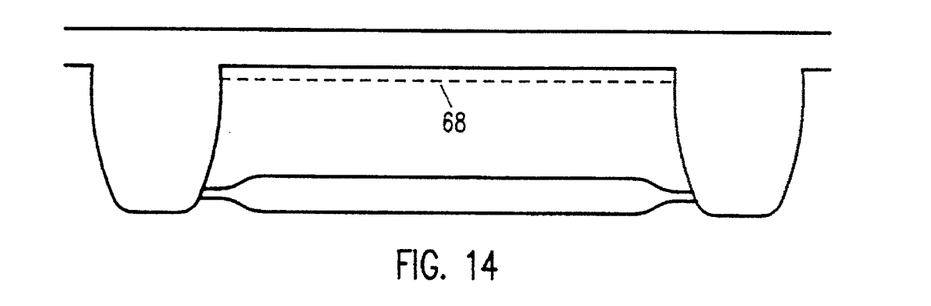

The next step is to form the "intrinsic base" 68 of FIG. 14. This may be done with a low or high energy implant, and will normally be boron doping at a density of around $10^{13}/cm^2$, much lighter than emitter doses. This implant could be a blanket implant if all of the devices on the die are identical. However, in the context of a BiCMOS process, a mask would be required to protect the CMOS devices.

Figure 15:
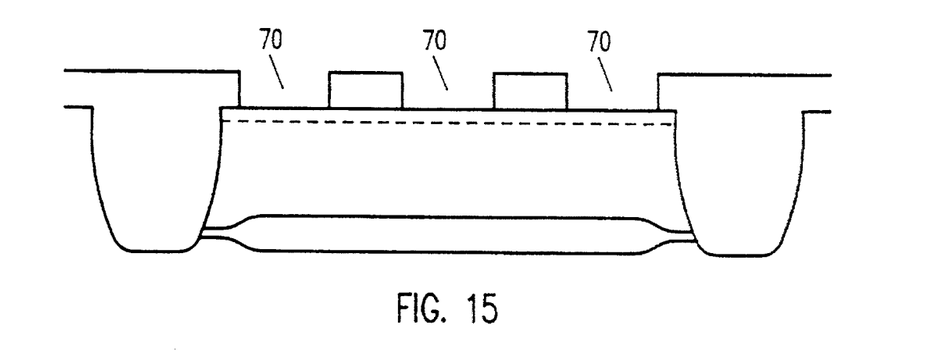
Figure 16:
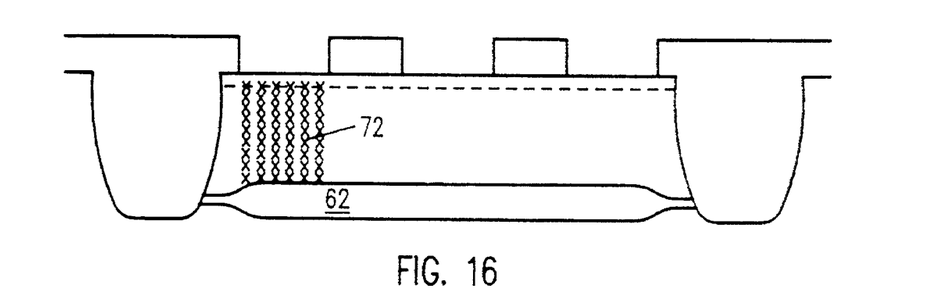
Figure 17:
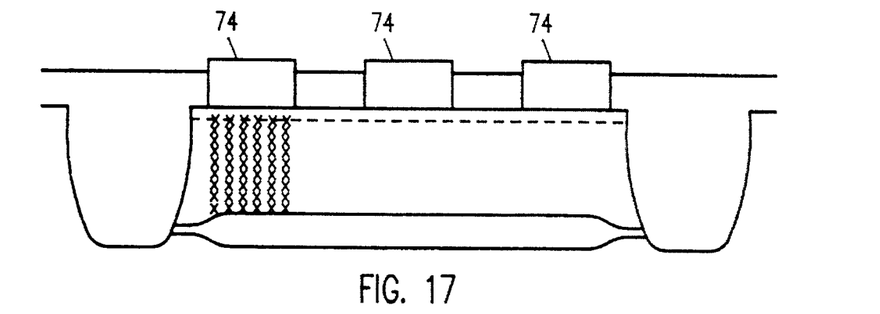
Figure 18:
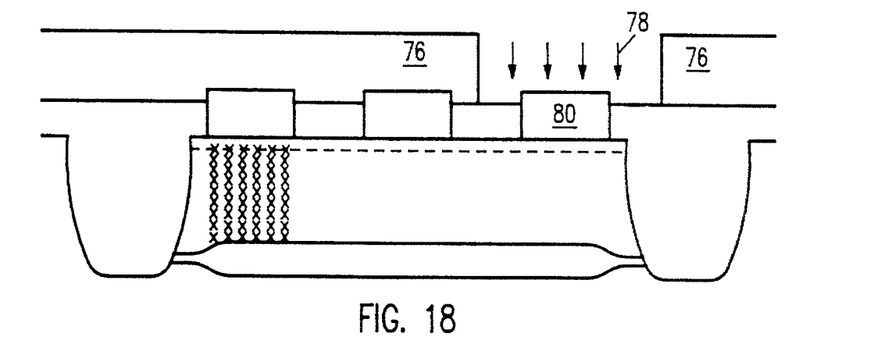
Figure 19:
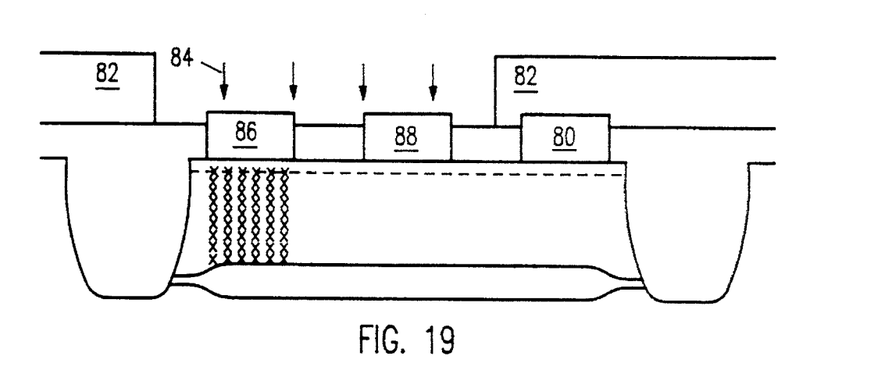

Next, as shown in FIG. 15, apertures 70 are etched in the oxide 66 for base, emitter, and collector contacts. Using an implant mask, an implant of phosphorus or arsenic is used to form a highly conductive path 72 to the sub-collector 62 (FIG. 16). Implant damage is not critical in this step. A silicon-germanium layer 74 is then selectively deposited on the areas free of the oxide layer as shown in FIG. 17, forming what will become the base, emitter, and collector contacts. Using a photoresist mask 76, boron 78 is selectively implanted in the silicon-germanium which will form the base 80 contact (FIG. 18). After the photoresist is removed, a heat treatment may be used to establish the desired boron diffusion profile. This heat treatment must account for the fact that there will be subsequent heat treatments. Then, as shown in FIG. 19, using a photoresist mask 82, arsenic 84 is selectively implanted in the silicon-germanium which will form the collector 86 and emitter 88 contacts. The final critical step is a heat treatment. During this heat treatment, the arsenic and boron diffuse into the underlying silicon forming the base 80, collector 86, and emitter 88 contacts.

Figure 20:
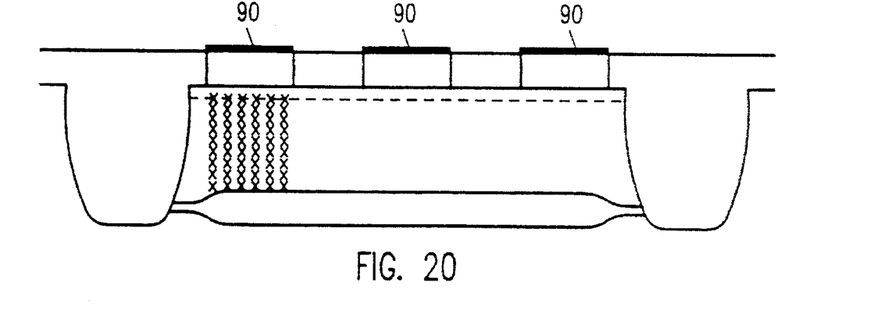

After the final critical heat treatment described above, processing follows methods commonly used in the industry for interconnecting integrated circuits. Two options are available. The interconnect metal (e.g., aluminum) may contact the silicon-germanium alloy regions directly, with an adherence enhancing layer 90 (e.g., TiW) applied before the interconnect metal (FIG. 20). Or, the silicon-germanium material may be selectively etched away prior to interconnection. In this case, the adherence layer must then also contribute to the protection of the shallow junction from the interconnect metal. Materials such as titanium (very thin) followed by titanium nitride are commonly used.

Throughout this section, SiGe or silicon-germanium alloy designations have been used generically. That is, the SiGe does not have to be single crystal; in general, it will be polycrystalline. Moreover, where appropriate, germanium may be used. In general, the germanium so deposited will be polycrystalline.

The devices resulting from the above-described process will have low defect densities because the SiGe layers sustain the damage generated by ion implantation and confine that damage to the SiGe regions. Reduced defect densities in the emitter region of the transistors will yield more good dies because of the lower incidence of emitter to base or emitter to collector short circuits, and lower leakage currents in the emitter-base junctions.

"Defect-free" bipolar and self-aligned CMOS processes have been discussed. The suppression of defects results from the use of an alternative to direct implantation. Use of polysilicon-germanium alloys or germanium, as a limiting case, is favored because of their selectivity properties. This selectivity is displayed with respect to both deposition and etching; consequently, these materials can serve as masks as well as convenient diffusion sources. The criteria for materials that could replace the poly-SiGe or germanium are that they exhibit deposition and etching selectivity with respect to silicon, polysilicon, and $SiO_2$, and that they can serve as convenient dopant reservoirs and act, subsequently, as sources for active dopant species during diffusion cycles.

While the invention has been particularly shown and described with reference to a specific embodiment thereof, it will be understood by those skilled in the art that the foregoing and other changes in the form and details may be made therein without departing from the spirit or scope of the invention.

What is claimed is:

1. A method for manufacturing a bipolar device wherein damage to active regions of the device due to direct implantation of impurities is suppressed, the bipolar device having an oxide layer in which apertures have been formed for base, emitter, and collector contacts, the method comprising the steps of:

selectively depositing a buffer material on the active regions in the apertures in the oxide layer, the buffer material comprising germanium;

implanting a first impurity of a first conductivity type into the buffer material formed in the base contact aperture;

implanting a second impurity of a second conductivity type into the buffer material formed in the collector and emitter contact apertures; and diffusing the impurities into the active regions of the device.

2. The method of claim 1 wherein the buffer material comprises a silicon-germanium alloy.

3. The method of claim 1 wherein the step of diffusing the impurities comprises performing a furnace anneal process.

4. The method of claim 1 wherein the step of diffusing the impurities comprises performing a rapid thermal anneal process.

5. The method of claim 1 wherein the diffusing step results in the impurities diffusing to diffusion depths, the diffusion depths being controlled by a plurality of parameters, the parameters comprising thickness of the buffer material, energy of the impurity implants, density of the impurity implants, and concentration of germanium in the buffer material.

6. A method for manufacturing a bipolar device wherein damage to active regions of the device due to direct implantation of impurities is suppressed, the method comprising the steps of:

depositing an oxide layer over the device;

etching apertures in the oxide layer for base, emitter, and collector contacts;

selectively depositing a silicon-germanium alloy on the active regions in the apertures in the oxide layer;

implanting first impurities of a first conductivity type into the buffer material formed in the base contact aperture;

implanting second impurities of a second conductivity type into the silicon-germanium alloy formed in the collector and emitter contact apertures;

diffusing the first and second impurities into the active regions of the device; and forming contacts on the buffer material.

7. The method of claim 6 wherein the step of diffusing the impurities is comprises performing a furnace anneal process.

8. The method of claim 6 wherein the step of diffusing the impurities is comprises performing a rapid thermal anneal process.

9. The method of claim 6 wherein the diffusing step results in the impurities diffusing to diffusion depths, the diffusion depths being controlled by a plurality of parameters, the parameters comprising thickness of the buffer material, energy of the impurity implants, density of the impurity implants, and concentration of germanium in the buffer material.

10. A method for manufacturing a bipolar device wherein damage to active regions of the device due to direct implantation of impurities is suppressed, the method comprising the steps of:

forming an n-type sub-collector region in a p-type semiconductor substrate;

growing an n-type epitaxial layer to supply proper collector doping, the epitaxial layer being lightly doped with respect to the sub-collector region;

forming active regions in the semiconductor device;

depositing an oxide layer over the device;

forming an intrinsic base by implanting first p-type impurities;

etching apertures in the oxide layer for base, emitter, and collector contacts;

implanting first n-type impurities into the collector contact aperture to form a highly conductive path to the sub-collector;

selectively depositing a first silicon-germanium alloy on areas free of the oxide layer;

forming a first mask over the collector and emitter contact apertures;

implanting second p-type impurities into the first silicon-germanium alloy formed in the base contact aperture;

removing the first mask;

forming a second mask over the base contact aperture;

implanting second n-type impurities into the first silicon-germanium alloy formed in the collector and emitter contact apertures;

removing the second mask;

diffusing the second n-type and second p-type impurities into the active regions of the device; and forming silicide contacts on the first material.

11. The method of claim 10 wherein the step of diffusing the second n-type and second p-type impurities comprises performing a furnace anneal process.

12. The method of claim 10 wherein the step of diffusing the second n-type and second p-type impurities comprises performing a rapid thermal anneal process.

13. The method of claim 10 wherein the diffusing step results in the impurities diffusing to a diffusion depth, the diffusion depth being controlled by a plurality of parameters, the parameters comprising thickness of the first material, energy of the impurity implants, density of the impurity implants, and concentration of germanium in the first material.

14. A method for manufacturing a bipolar device wherein damage to active regions of the device due to direct implantation of impurities is suppressed, the method comprising the steps of:

forming an p-type sub-collector region in a n-type semiconductor substrate;

growing an p-type epitaxial layer to supply proper collector doping, the epitaxial layer being lightly doped with respect to the sub-collector region;

forming active regions in the semiconductor device;

depositing an oxide layer over the device;

forming an intrinsic base by implanting first n-type impurities;

etching apertures in the oxide layer for base, emitter, and collector contacts;

implanting first p-type impurities into the collector contact aperture to form a highly conductive path to the sub-collector;

selectively depositing a first silicon-germanium alloy on areas free of the oxide layer;

forming a first mask over the collector and emitter contact apertures;

implanting second n-type impurities into the first silicon-germanium alloy formed in the base contact aperture;

removing the first mask;

forming a second mask over the base contact aperture;

implanting second p-type impurities into the first silicon-germanium alloy formed in the collector and emitter contact apertures;

removing the second mask;

diffusing the second p-type and second n-type impurities into the active regions of the device; and forming silicide contacts on the first material.

15. The method of claim 14 wherein the step of diffusing the second n-type and second p-type impurities comprises performing a furnace anneal process.

16. The method of claim 14 wherein the step of diffusing the second n-type and second p-type impurities comprises performing a rapid thermal anneal process.

17. The method of claim 14 wherein the diffusing step results in the impurities diffusing to a diffusion depth, the diffusion depth being controlled by a plurality of parameters, the parameters comprising thickness of the first material, energy of the impurity implants, density of the impurity implants, and concentration of germanium in the first material.

* * * * *